(12) United States Patent
Mendendorp, Jr. et al.

(10) Patent No.: US 7,808,013 B2
(45) Date of Patent: Oct. 5, 2010

(54) INTEGRATED HEAT SPREADERS FOR LIGHT EMITTING DEVICES (LEDS) AND RELATED ASSEMBLIES

(75) Inventors: Nicholas W. Mendendorp, Jr., Raleigh, NC (US); Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 66 days.

(21) Appl. No.: 11/590,480

(22) Filed: Oct. 31, 2006

(65) Prior Publication Data

US 2008/0099770 A1    May 1, 2008

(51) Int. Cl.
*H01L 33/00* (2010.01)
*H01L 23/495* (2006.01)

(52) U.S. Cl. ........................................ 257/99; 257/675

(58) Field of Classification Search ........... 257/78–103, 257/675, E33.072
See application file for complete search history.

(56) References Cited

U.S. PATENT DOCUMENTS

| | | | |
|---|---|---|---|
| 3,805,347 A | 4/1974 | Collins et al. | |
| 3,875,456 A | 4/1975 | Kano et al. | |
| 4,822,536 A | 4/1989 | Voinis et al. | |
| 4,918,497 A | 4/1990 | Edmond | |
| 4,966,862 A | 10/1990 | Edmond | |
| 5,027,168 A | 6/1991 | Edmond | |
| 5,043,716 A | 8/1991 | Latz et al. | |
| 5,119,174 A | 6/1992 | Chen | |
| 5,177,593 A * | 1/1993 | Abe | 257/98 |
| 5,210,051 A | 5/1993 | Carter, Jr. | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,817,405 A * | 10/1998 | Bhatt et al. | 428/209 |
| 5,912,477 A | 6/1999 | Negley | |

(Continued)

FOREIGN PATENT DOCUMENTS

DE    101 09 349    9/2002

(Continued)

OTHER PUBLICATIONS

U.S. Appl. No. 11/197,096, filed Aug. 4, 2005 entitled "Packages for Semiconductor Light Emitting Devices Utilizing Dispensed Encapsulants and Methods of Packaging the Same".

(Continued)

*Primary Examiner*—Cuong Q Nguyen
(74) *Attorney, Agent, or Firm*—Myers Bigel Sibley & Sajovec, P.A.

(57) ABSTRACT

A light emitting device (LED) assembly may include an electrically insulating substrate and a thermally conductive layer on a surface of the insulating substrate. A light emitting device may be on the thermally conductive layer so that the thermally conductive layer is between the light emitting device and the electrically insulating substrate. Moreover, the thermally conductive layer may extend beyond an edge of the light emitting device in at least one direction a distance greater than half of a width of the light emitting device.

59 Claims, 5 Drawing Sheets

U.S. PATENT DOCUMENTS

| | | | |
|---|---|---|---|
| 5,942,770 A * | 8/1999 | Ishinaga et al. | 257/89 |
| 5,959,316 A | 9/1999 | Lowery | |
| 6,117,705 A * | 9/2000 | Glenn et al. | 438/106 |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,282,094 B1 * | 8/2001 | Lo et al. | 361/704 |
| 6,335,548 B1 * | 1/2002 | Roberts et al. | 257/98 |
| 6,610,563 B1 | 8/2003 | Waitl et al. | |
| 6,635,363 B1 | 10/2003 | Duclos et al. | |
| 6,642,652 B2 | 11/2003 | Collins, III et al. | |
| 6,730,933 B1 | 5/2004 | Shimizu et al. | |
| 6,744,077 B2 | 6/2004 | Trottier et al. | |
| 6,746,295 B2 | 6/2004 | Song | |
| 6,747,406 B1 | 6/2004 | Bortscheller et al. | |
| 6,917,057 B2 | 7/2005 | Stokes et al. | |
| 7,084,435 B2 * | 8/2006 | Sugimoto et al. | 257/99 |
| 2001/0030326 A1 | 10/2001 | Reeh et al. | |
| 2002/0057056 A1 | 5/2002 | Okazaki | |
| 2002/0079837 A1 | 6/2002 | Okazaki | |
| 2002/0123164 A1 | 9/2002 | Slater, Jr. et al. | |
| 2002/0163001 A1 | 11/2002 | Shaddock | |
| 2003/0006418 A1 | 1/2003 | Emerson et al. | |
| 2003/0141510 A1 | 7/2003 | Brunner et al. | |
| 2003/0211804 A1 | 11/2003 | Sorg | |
| 2004/0041222 A1 | 3/2004 | Loh | |
| 2004/0056260 A1 | 3/2004 | Slater, Jr. et al. | |
| 2004/0079957 A1 * | 4/2004 | Andrews et al. | 257/100 |
| 2004/0188696 A1 * | 9/2004 | Hsing Chen et al. | 257/99 |
| 2005/0122031 A1 * | 6/2005 | Itai et al. | 313/498 |
| 2005/0218421 A1 | 10/2005 | Andrews et al. | |
| 2005/0221518 A1 | 10/2005 | Andrews et al. | |
| 2005/0274957 A1 | 12/2005 | Wang et al. | |
| 2007/0235739 A1 * | 10/2007 | Sun et al. | 257/79 |
| 2008/0043444 A1 | 2/2008 | Hasegawa et al. | |

FOREIGN PATENT DOCUMENTS

| | | |
|---|---|---|
| EP | 1 187 226 | 3/2002 |
| EP | 1 246 266 | 10/2002 |
| EP | 1760784 | 3/2007 |
| JP | 08032120 | 2/1996 |
| JP | 09027643 | 1/1997 |
| JP | 10-65220 | 3/1998 |
| JP | 10-190065 | 7/1998 |
| JP | 11026647 A | 1/1999 |
| JP | 11-298050 | 10/1999 |
| JP | 2005317596 A | 11/2005 |
| JP | 2006128512 A | 5/2006 |
| JP | 2006245032 A | 9/2006 |
| WO | WO 01/15242 | 3/2001 |
| WO | WO 2004/068594 | 8/2004 |

OTHER PUBLICATIONS

International Preliminary Report on Patentability for International Application No. PCT/US2007/022576, mailed Oct. 14, 2008 (12 pages).

* cited by examiner

INTEGRATED HEAT SPREADERS FOR LIGHT EMITTING DEVICES (LEDS) AND RELATED ASSEMBLIES

FIELD OF THE INVENTION

This invention relates to semiconductor devices, and more particularly to semiconductor light emitting devices and related methods and packages.

BACKGROUND

Light emitting diodes and laser diodes are well known solid state electronic light emitting devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). To facilitate application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

To use an LED chip in a circuit, it is known to enclose an LED chip in a package to provide environmental and/or mechanical protection, color selection, focusing and the like. An LED package also includes electrical leads, contacts or traces for electrically connecting the LED package to an external circuit. In a typical LED package, an LED chip is mounted on a reflective cup by means of a solder bond or conductive epoxy. One or more wirebonds connect the ohmic contacts of the LED chip to leads which may be attached to or integral with the reflective cup. The reflective cup may be filled with an encapsulant material containing a wavelength conversion material such as a phosphor. Light emitted by the LED at a first wavelength may be absorbed by the phosphor, which may responsively emit light at a second wavelength. The entire assembly is then encapsulated in a clear protective resin, which may be molded in the shape of a lens to collimate the light emitted from the LED chip. Some LED packages have one or more LED chips mounted onto a carrier such as a printed circuit board (PCB) carrier.

During operation of the LED or LEDs, large amounts of heat may be generated. Much of the heat may be dissipated by the substrate and the reflector cup, each of which may act as a heatsink for the package. However, the temperature of the package may still increase significantly during operation. Substrates typically have low thermal conductivity. Additionally, while the reflective cup directs light upward, some light may be absorbed by the reflector cup or there may be reasons not to use a separate metal piece as a metal reflector.

Encapsulant materials, such as silicone gels, typically have high coefficients of thermal expansion. As a result, when the package heats up, the encapsulant material may expand. As the lens is mounted within a channel defined by the sidewalls of the reflector cup, the lens may travel up and down within the sidewalls as the encapsulant material expands and contracts. Expansion of the encapsulant material may extrude the encapsulant into spaces or out of the cavity such that, when cooled, it may not move back into the cavity. This could cause delamination, voids, higher triaxial stresses and/or the like, which may result in less robust light emitting devices. Accordingly, there continues to exist a need in the art for more effective methods for heat spreading and lowering thermal resistances of LED systems.

SUMMARY

According to some embodiments of the present invention, a light emitting device (LED) assembly may include an electrically insulating substrate and a thermally conductive layer on a surface of the insulating substrate. A light emitting device may be on the thermally conductive layer so that the thermally conductive layer is between the light emitting device and the electrically insulating substrate. Moreover, the thermally conductive layer may extend beyond an edge of the light emitting device in at least one direction a distance greater than half of a width of the light emitting device.

In addition, a plurality of thermally conductive vias may be thermally coupled to the thermally conductive layer, and portions of the substrate adjacent the light emitting device may be free of the thermally conductive vias. Moreover, the thermally conductive vias may extend from the thermally conductive layer through the electrically insulating substrate. The thermally conductive layer may include a metal layer such as a copper layer.

The thermally conductive layer may be electrically conductive, and the light emitting device assembly may also include a first electrical coupling between a first terminal of the light emitting device and the thermally conductive layer. An electrode may be on the electrically insulating substrate with the electrode and the thermally conductive layer being electrically isolated, and a second electrical coupling may be provided between a second terminal of the light emitting device and the electrode.

The thermally conductive layer may be electrically conductive, and the light emitting device assembly may further include first and second electrodes, each of which is electrically isolated from the thermally conductive layer. A first electrical coupling may be provided between a first terminal of the light emitting device and the first electrode, and a second electrical coupling may be provided between a second terminal of the light emitting device and the second electrode.

The thermally conductive layer may be electrically conductive, and the thermally conductive layer may be a substantially circular thermally conductive layer. Moreover, a first portion of the substantially circular thermally conductive layer may be electrically isolated from a second portion of the substantially circular thermally conductive layer. In addition or in an alternative, the substantially circular thermally conductive layer may include a plurality of notches around a perimeter thereof. Moreover, each of the notches may extend radially from the perimeter of the thermally conductive layer toward the light emitting device. In addition, a conductive trace on the electrically insulating substrate may extend from the substantially circular thermally conductive layer.

According to additional embodiments of the present invention, a light emitting device assembly may include an electrically insulating substrate having opposing first and second surfaces. A first thermally conductive layer may be provided on the first surface of the electrically insulating substrate, and a second thermally conductive layer may be provided on the second surface of the electrically insulating substrate. In addition, a light emitting device may be provided on the first thermally conductive layer so that the first thermally conductive layer is between the light emitting device and the electrically insulating substrate. Moreover, a plurality of thermally conductive vias may be thermally coupled between the first and second thermally conductive layers, and portions of the substrate between the light emitting device and the second thermally conductive layer may be free of the thermally conductive vias.

The thermally conductive vias may extend from the first thermally conductive layer through the electrically insulating substrate to the second thermally conductive layer. In addition, the first thermally conductive layer may extend beyond edges of the light emitting device a distance greater than half of a width of the light emitting device. Each of the first and second thermally conductive layer may include respective first and second metal layers, such as respective copper layers, and the first thermally conductive layer may be electrically isolated from first and second terminals of the LED.

The first and second thermally conductive layers may be electrically conductive, and the light emitting device assembly may further include a first electrical coupling between a first terminal of the light emitting device and the first thermally conductive layer. An electrode may be provided on the electrically insulating substrate with the terminal and the first and second thermally conductive layers being electrically isolated. A second electrical coupling may be provided between a second terminal of the light emitting device and the electrode.

The first and second thermally conductive layers may be electrically conductive, and the light emitting device assembly may further include first and second electrodes, each of which is electrically isolated from the first and second thermally conductive layers. A first electrical coupling may be provided between a first terminal of the light emitting device and the first electrode, and a second electrical coupling may be provided between a second terminal of the light emitting device and the second electrode.

The first thermally conductive layer may be electrically conductive, and the first thermally conductive layer may be a substantially circular thermally conductive layer. A first portion of the substantially circular thermally conductive layer may be electrically isolated from a second portion of the substantially circular thermally conductive layer. Moreover, the substantially circular thermally conductive layer may include a plurality of notches around a perimeter thereof. In addition, a conductive trace on the electrically insulating substrate may extend from the substantially circular thermally conductive layer.

According to still other embodiments of the present invention, a light emitting device (LED) assembly may include an electrically insulating substrate and a substantially circular thermally conductive layer on a surface of the insulating substrate. A light emitting device may be provided on the substantially circular thermally conductive layer so that the substantially circular thermally conductive layer is between the light emitting device and the electrically insulating substrate.

A first portion of the substantially circular thermally conductive layer may be electrically isolated from a second portion of the substantially circular thermally conductive layer. The substantially circular thermally conductive layer may include a plurality of notches around a perimeter thereof. Moreover, each of the notches may extend radially from the perimeter of the substantially circular thermally conductive layer toward the light emitting device.

In addition, a conductive trace on the electrically insulating substrate may extend from the substantially circular thermally conductive layer. The substantially circular thermally conductive layer may extend beyond edges of the light emitting device a distance greater than half of a width of the light emitting device. The substantially circular thermally conductive layer may include a metal layer.

The light emitting device assembly may further include a second thermally conductive layer on a second surface of the electrically insulating substrate so that the electrically insulating substrate is between the substantially circular thermally conductive layer and the second thermally conductive layer. A plurality of thermally conductive vias may be thermally coupled between the substantially circular thermally conductive layer and the second thermally conductive layer, and portions of the substrate between the light emitting device and the second thermally conductive layer may be free of the thermally conductive vias. Moreover, first and second terminals of the light emitting device may be electrically isolated from the substantially circular thermally conductive layer.

DETAILED DESCRIPTION

Figure 1A:
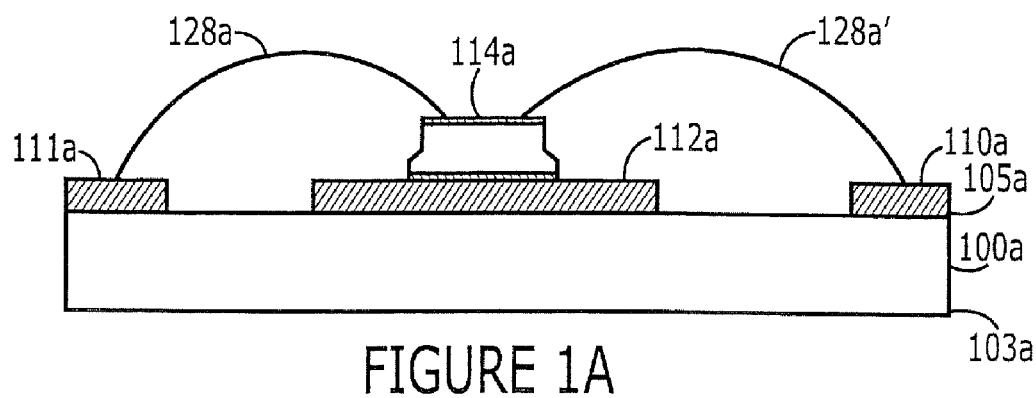
FIGS. 1A-E are cross-sectional views illustrating light emitting device packages with a thermally conductive layer according to some embodiments of the present invention.

The present invention will now be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of the present invention used to package a semiconductor light emitting device will be described herein. As used herein, the term semiconductor light emitting device (LED) may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrates. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, semiconductor light emitting devices (LEDs) discussed herein may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor, the disclosures of which are hereby incorporated herein in their entirety by reference. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Referring to the embodiments of FIGS. 1A-E, 2, 3, 4A-C, and 5, each of substrates 100a-k (also referred to as submounts) may have respective upper surfaces 105a-k and lower surfaces 103a-k as shown. Each of the substrates 100a-k may include a printed circuit board (PCB) substrate, an aluminum block substrate, an alumina substrate, an aluminum nitride substrate, a sapphire substrate, and/or a silicon substrate, and/or any other suitable substrate material, such as a T-Clad thermal clad insulated substrate material, available from The Bergquist Company of Chanhassen, Minn. A PCB substrate may include standard FR-4 PCB, a metal-core PCB, flex tape, and/or any other type of printed circuit board.

Figure 1B:
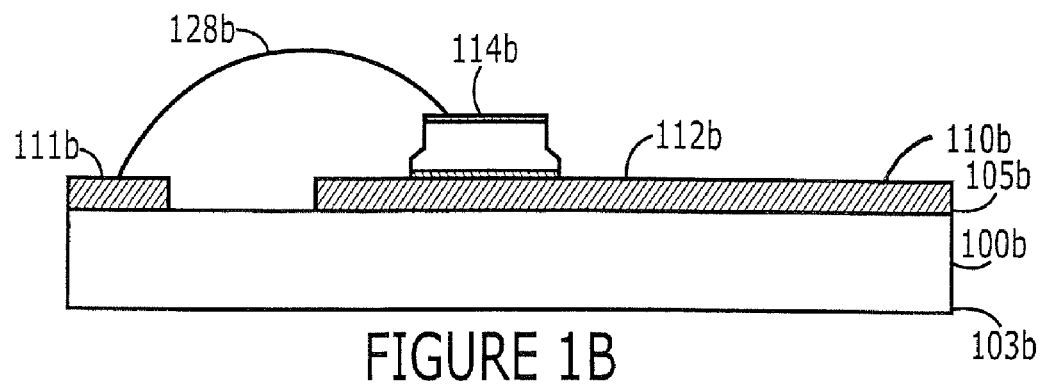
Figure 1C:
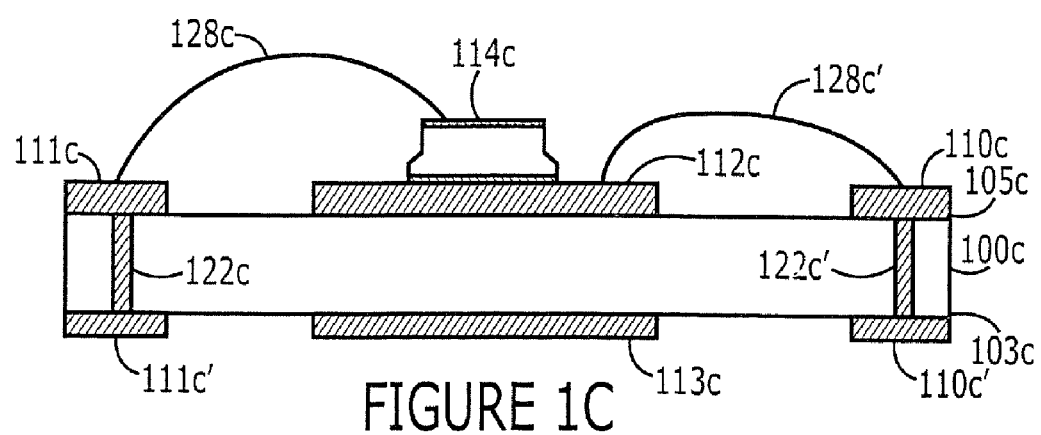
Figure 1D:
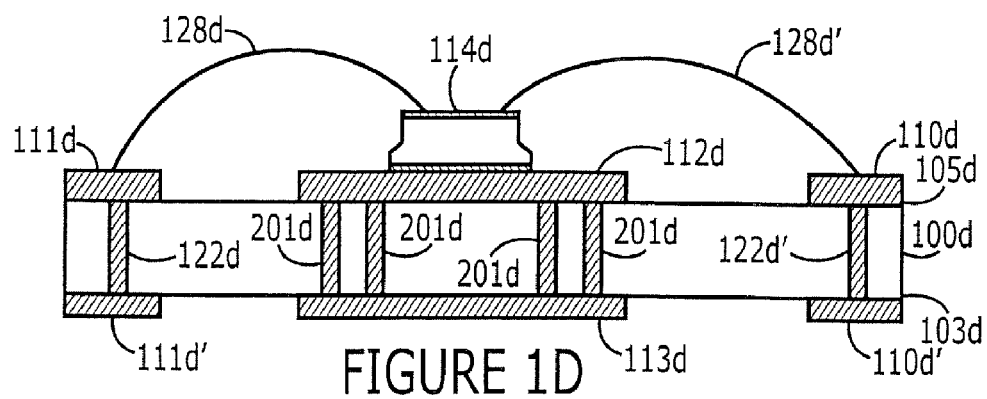
Figure 1E:
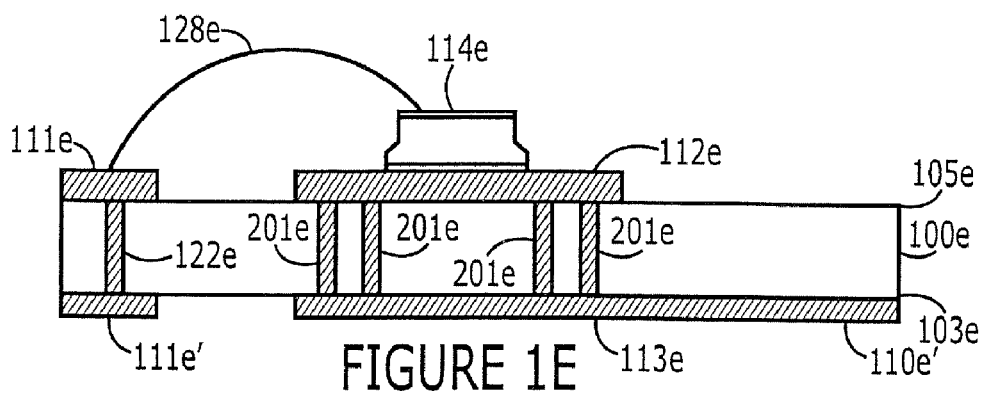
Figure 2:
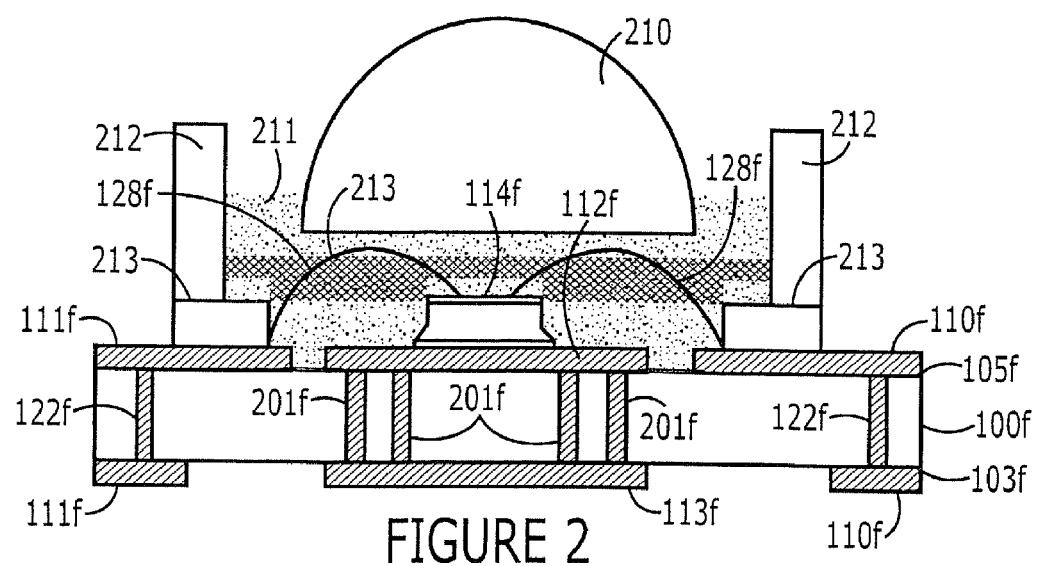
FIGS. 2-3 are cross sectional views of light emitting device packages including lenses according to additional embodiments of the present invention.
Figure 3:
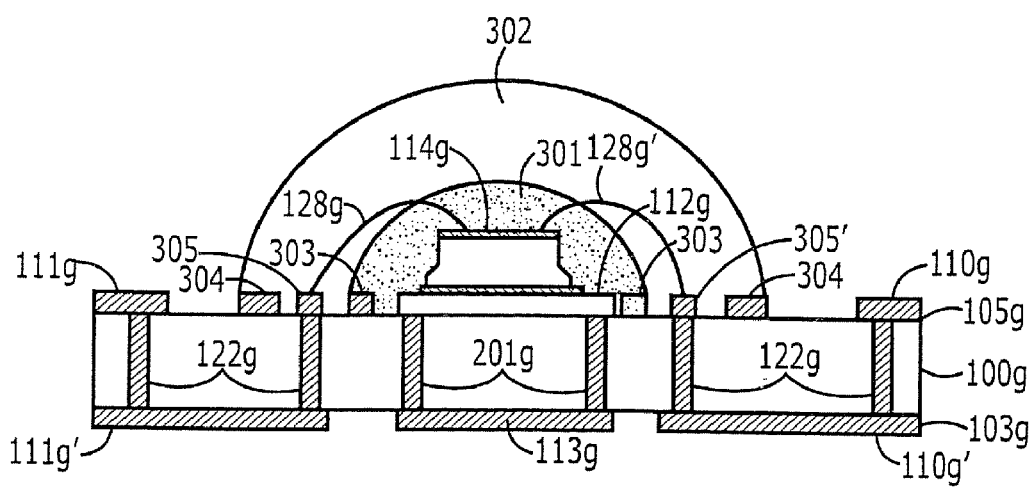

As illustrated in FIGS. 1A-E, 2, 3, 4A-C, and 5, a patterned metal feature(s) may be formed on upper surfaces 105a-k of the respective substrates 100a-k. The patterned metal feature(s) may include a thermally conductive layer(s) 112a-k, meniscus control feature(s) 303 and/or 304 (as shown in FIG. 3), a wirebond pad(s) 305 (as shown in FIG. 3), and/or electrodes 110a-k and/or 111a-k. The conductive features on top surfaces 105a-k of substrate 100a-k may be formed, for example, using a plating process. A plating process may be used to plate a thin or thick metallic film on a substrate. In a typical plating process, a titanium adhesion layer and a copper seed layer may be sequentially sputtered onto the substrate. Then, approximately 75 microns of copper may be plated onto the copper seed layer. Alternatively, the adhesion layer and seed layer may be sputtered using, for example, a metal mask to form a desired pattern. A plating process may also be used to form conductive metal vias through a substrate. In an alternative, a deposited metal film may be patterned using standard lithographic processes to provide metal features on the substrate having desired patterns.

In some embodiments of the invention illustrated in FIG. 3, first and second meniscus control features 303 and 304 may be formed of a material different from the thermally conductive layer 112g and/or the wirebond pads 305. For example, the meniscus control features 303 and 304 may comprise a polymer such as a solder mask material including, for example, polyimide. A polymer such as polyimide, for example, may provide a suitable material for use as a meniscus control feature because polyimide may provide a relatively a low surface energy, which may provide improved meniscus control properties.

Lateral dimensions (parallel to the substrate) and thicknesses of the thermally conductive layers 112a-k may vary based on the heat spreading properties of the materials used. Heat spreading may be increased when a diameter or width (parallel to the surface of the substrate) of the thermally conductive layer 112a-k extends from an edge or edges of the LED source 114a-k a distance that is at least half of the width of the LED source 114a-k, and according to some embodiments of the present invention, a distance that is at least the width of the LED source 114a-k. Moreover, the thermally conductive layer 112a-k may extend beyond edges of the LED 114a-k a distance greater than twice a thickness of the thermally conductive layer. According to some embodiments of the present invention, the thermally conductive layer 112a-k may include a layer of a metal (such as copper, aluminum, gold, tin, tin-silver, and/or copper-tin), a layer of a ceramic (such as aluminum-nitride), and/or a layer of a semiconductor material (such as silicon carbide). With a layer of copper provided as a thermally conductive layer 112a-k, the copper thermally conductive layer(s) may be configured so that a ratio of a diameter or width (parallel to the surface of the substrate) of the copper thermally conductive layer(s) 112a-k with respect to a thickness (perpendicular to the surface of the substrate) may be in the range of at least about 25 to about 140. With a layer of aluminum provided as a thermally conductive layer 112a-k, the aluminum thermally conductive layer(s) may be configured so that a ratio of a diameter or width (parallel to the surface of the substrate) of the aluminum thermally conductive layer(s) 112a-k with respect to a thickness (perpendicular to the surface of the substrate) may be in the range of at least about 7 to about 50.

One or more of the electrodes 110a-k and/or 111a-k may be formed on an upper surface 105a-k of the respective substrate 100a-k. In addition, one or more lower electrodes 110c'-g' and/or 111c'-g' may be formed on a lower surface 103c-g of the respective substrate 100c-g as shown in FIGS. 1C-E, 2, and 3. One or more conductive vias 122c-g may connect one or more of the lower electrodes 110c'-g' and/or 111c'-g' to various features on an upper surface 105c-g of the respective substrate 100c-g. For example, one of the conductive vias 122c-g and/or 122c'-g' may electrically connect electrodes 110c-g and/or 111c-g with respective lower electrodes 110c'-g' and/or 111c'/g'. Accordingly, respective conductive features formed on upper surfaces 105c-g of substrates 100c-g may be formed of a same material. For example, the conductive features may include copper deposited using a plating process.

In some other embodiments of the present invention, some conductive features may include additional metals. For example, the thermally conductive layer(s) 112a-k may be plated and/or coated with additional metals and/or other materials to make the thermally conductive layer(s) 112a-k more suitable for mounting a respective LED chip 114a-k thereon. For example, the thermally conductive layer(s) 112a-k may be plated with additional layers such as, for example, additional adhesive, bonding, reflector, die attach pad and/or barrier layers (not shown). These layers can be in addition to the thermally conductive layer, and these additional layers may also be thermally conductive. In an alternative, a direct die attach may be performed using flux instead of Au/Sn solder paste to reduce a thermal resistance between an LED 114a-k and the respective thermally conductive layer 112a-k and/or to reduce voiding. Direct die attach may enable use of a discrete zener device for ESD protection in another area of the LED system. The LED(s) 114a-k and respective thermally conductive layer(s) 112a-k may be configured to provide coupling with vertical, planar, and/or flip-chip LEDs.

As illustrated in FIGS. 1A-E, a thermally conductive layer 112a-e may be formed on an upper (primary) surface 105a-e of respective substrate 100a-e. As shown in FIGS. 1C-1E, a second thermally conductive layer 113c-e may also be formed on a lower (secondary) surface 103c-e of the respective substrate 103C-E. As shown in FIGS. 1D-E, thermally conductive vias 201d-e may be thermally coupled between first thermally conductive layer(s) 112d-e and second thermally conductive layer(s) 113d-e. The thermally conductive vias 201d-e may extend through the substrate 100d-e to improve thermal coupling between the first thermally conductive layer(s) 112d-e and the second thermally conductive layer(s) 113d-e. A profile of each via through the substrate (as viewed from above or below the substrate) may take any shape such as a circle, a square, a polygon, etc. Each thermally conductive via 201d-e may extend from any portion of the respective thermally conductive layer 112. According to some embodiments of the present invention, the thermally conductive vias 201d-e may be provided between the LED 114d-e and the second thermally conductive layer 113d-e to increase thermal conduction. According to some other embodiments of the present invention, the thermally conductive vias 201d-e may be spaced apart from (or laterally offset from) the respective LED 114d-e to improve a mechanical coupling between the LED 114d-e and the thermally conductive layer 112d-e. For example, a portion of the thermally conductive layer 112d-e that is free of thermally conductive vias 201d-e may provide a more planar surface to improve mechanical coupling with the LED 114d-e.

Figure 4A:
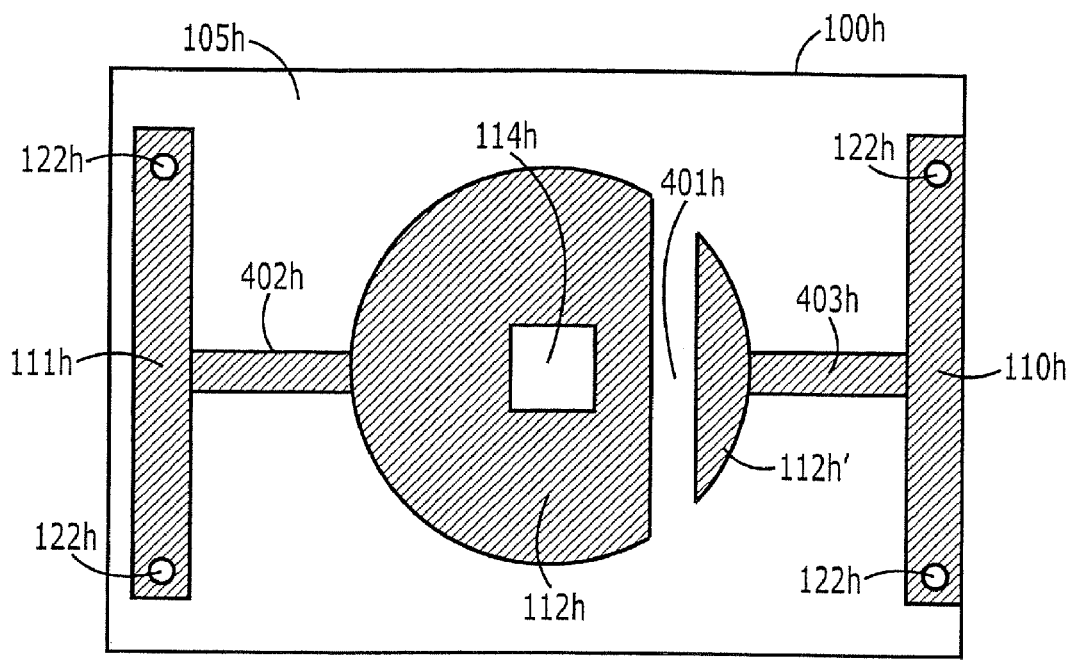
FIGS. 4A-C are plan views illustrating thermally conductive layers of light emitting devices according to some embodiments of the invention.
Figure 4B:
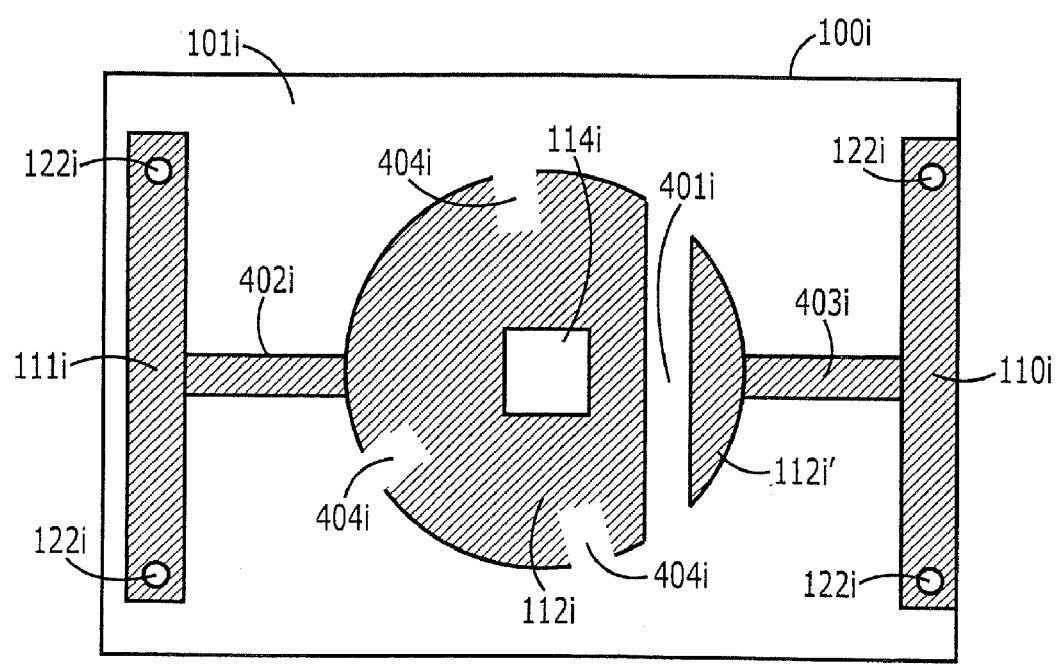

Because the thermally conductive layers 112a-e and/or 113c-e may be formed using thin film technologies according to some embodiments of the present invention, first and second thermally conductive layers 112a-e and/or 113c-e may be electrically isolated from the electrodes 110a-e and/or 111a-e as illustrated in FIGS. 1A, 1C, and/or 1D. This electrical isolation may be provided, for example, so that a material(s) for the thermally conductive layer(s) and for the electrodes may be different. As shown in FIGS. 1A-E, wirebonds 128a-e may be used to provide electrical coupling between the LEDs 114a-e and the respective electrodes 111a-e. As shown in FIGS. 1A and 1C-D, wirebonds 128a' and 128c'-d' may provide electrical coupling between LED's 114a and 114c-d and respective electrodes 110a and 110c-d. As shown in FIG. 1B, the thermally conductive layer 112b and the electrode 110b may be provided as a continuous/patterned layer of an electrically and thermally conductive material. For example, a patterned layer layer of a thermally conductive material may provide the thermally conductive layer 112b, the electrode 110b, and a conductive trace therebetween. As shown in FIGS. 4A-B, thermally conductive layer(s) 112h-i may be electrically coupled to respective electrode(s) 111h-i through conductive trace(s) 402h-i. Second thermally conductive layer 113e may be electrically coupled to an electrode 110e' as shown in FIG. 1E. The first thermally conductive layer 112e may be electrically coupled to an electrode 110e' on the lower surface 103e of the substrate 100e through electrically and thermally conductive vias 201e as shown in FIG. 1E.

While not shown in FIGS. 1A-E, structures of FIGS. 1A-E may be used together with lenses and/or reflection devices as illustrated, for example, in FIGS. 2 and 3. Moreover, the structure of FIG. 2 may be used with the lens of FIG. 3 and/or the structure of FIG. 3 may be used with the lens of FIG. 2. Moreover, structures including thermally conductive layers, thermally/electrically conductive vias, LEDs, electrodes, and/or substrates according to embodiments of the present invention (as discussed, for example, with respect to FIGS. 1A-E, 2, 3, 4A-B, and 5) may be used with additional elements of LED packaging as discussed, for example, in U.S. patent application Ser. Nos. 11/044,126 and 11/336,369, the disclosures of which are incorporated herein by reference as if set forth fully herein.

More particularly, the LED package of FIG. 1A may include a thermally conductive layer 112a between the LED 114a and the substrate 100a, and the thermally conductive layer 112a may extend beyond edges of the LED 114a a distance greater than half a width of the LED 114a, and according to some embodiments of the present invention, a distance that is greater than a width of the LED 114*a*. Moreover, the LED may be a horizontal LED such that both electrodes (i.e., the cathode and anode) thereof are on the surface of the LED 114*a* opposite the substrate 100*a*. Wirebonds 128*a* and 128*a*' may provide electrical coupling between the LED 114*a* and the electrodes 111*a* and 110*a*. The lower surface 103*a* of the substrate 100*a* opposite the LED 114*a* may thus be free of electrical connection. During operation, heat from the LED may be spread through the thermally conductive layer 112*a* and into the substrate 100*a*. The thermally conductive layer 112*a* may include an electrically and thermally conductive material such as copper. Moreover, the backside 103*a* of the substrate 100*a* may be thermally coupled to a heat sink and/or to a thermally conductive portion of another substrate (such as a printed circuit board) so that heat is conducted away from the substrate 100*a*.

The LED package of FIG. 1B may include a thermally conductive layer 112*b* between the LED 114*b* and the substrate 100*b*, and the thermally conductive layer 112*b* may extend beyond edges of the LED 114*b* a distance greater than half a width of the LED 114*b*, and according to some embodiments of the present invention, a distance that is greater than a width of the LED 114*b*. Moreover, the LED may be a vertical LED such that the electrodes (i.e., the cathode and anode) thereof are on opposite surfaces of the LED 114*b*. Wirebond 128*b* may provide electrical coupling between a first electrode of the LED 114*b* and the electrodes 111*b*. A second electrode of the LED 114*b* may be coupled directly to the thermally conductive layer 112*b*. As further shown in FIG. 1B, the thermally conductive layer 112*b* and the electrode 110*b* and a trace therebetween may be formed from a same layer of an electrically and thermally conductive material so that a second wirebond is not required. As with the structure of FIG. 1A, the lower surface 103*b* of the substrate 100*b* opposite the LED 114*b* may thus be free of electrical connection. During operation, heat from the LED 114*b* may be spread through the thermally conductive layer 112*b* and into the substrate 100*b*. The thermally conductive layer 112*a* may include an electrically and thermally conductive material such as copper. Moreover, the backside 103*b* of the substrate 100*b* may be thermally coupled to a heat sink and/or to a thermally conductive portion of another substrate (such as a printed circuit board) so that heat is conducted away from the substrate 100*b*. If the LED 114*b* is a horizontal LED, a second wirebond may be provided between the second electrode on a surface of the LED 114*b* opposite the thermally conductive layer 112*b* and the thermally conductive layer 112*b*.

The LED package of FIG. 1C may include a thermally conductive layer 112*c* between the LED 114*c* and the substrate 100*c*, and the thermally conductive layer 112*c* may extend beyond edges of the LED 114*a* a distance greater than half a width of the LED 114*c*, and according to some embodiments of the present invention, a distance that is greater than a width of the LED 114*c*. Moreover, the LED may be a vertical LED such that the electrodes (i.e., the cathode and anode) thereof are on opposite surfaces of the LED 114*c*. Wirebond 128*c* may provide electrical coupling between a first electrode of the LED 114*c* and the electrode 111*c*. The layer 112*c* may also be electrically conductive, and a second electrode of the LED 114*c* may be coupled directly to the thermally and electrically conductive layer 112*c*, and wirebond 128*c*' may provide electrical coupling between the thermally conductive layer 112*c* and the electrode 110*c*. In an alternative, a conductive trace may be provided between the thermally conductive layer 112*c* and the electrode 110*c* as discussed above with respect to FIG. 1B so that a second wirebond is not required.

In FIG. 1C, a second thermally conductive layer 113*c* may be provided on a backside 103*c* of the substrate 100*c* to enhance coupling of heat from the substrate 100*c* to a heat sink and/or to a thermally conductive portion of another circuit board (such as a printed circuit board). During operation, heat from the LED 114*c* may be spread through the thermally conductive layer 112*c* and into the substrate 100*c* and the second thermally conductive layer 113*c*. The thermally conductive layers 112*c* and 113*c* may each include a thermally conductive material such as copper. Moreover, the backside 103*c* of the substrate 100*c* may be thermally coupled to a heat sink and/or to a thermally conductive portion of another substrate (such as a printed circuit board) so that heat is conducted away from the substrate 100*c*. If the LED 114*c* is a horizontal LED, the second wirebond 128*c*' may be provided between the second electrode on a surface of the LED 114*c* opposite the thermally conductive layer 112*c* and the electrode 110*c*.

As further shown in FIG. 1C, secondary electrodes 111*c*' and 110*c*' may be provided on the backside 103*c* of the substrate 100*c*, and the secondary electrodes 111*c*' and 110*c*' may be electrically coupled to the electrodes 111*c* and 110*c* on the frontside 105*c* of the substrate 100*c* through electrically conductive vias 122*c* and 122*c*'. The substrate 100*c* can thus be mounted on a printed circuit board with the secondary electrodes 111*c*' and 110*c*' providing electrical coupling to the printed circuit board. In an alternative, conductive vias 122*c* and 122*c*' and secondary electrodes 111*c*' and 110*c*' may be omitted if electrical coupling to another substrate is provided directly to the electrodes 111*c* and 110*c*.

Moreover, electrically conductive vias and secondary electrodes as discussed above with respect to FIG. 1C may be applied to the structures of FIGS. 1A and/or 1B according to some embodiments of the present invention. For example, secondary electrodes on the backside 103*a* of substrate 100*a* of FIG. 1A may be electrically coupled to electrodes 111*a* and 110*a* using respective conductive vias through the substrate 100*a*. Similarly, secondary electrodes on the backside 103*b* of substrate 100*b* of FIG. 1B may be electrically coupled to electrodes 111*b* and 110*b* using respective conductive vias through the substrate 100*b*.

The LED package of FIG. 1D may include a thermally conductive layer 112*d* between the LED 114*d* and the substrate 100*d*, and the thermally conductive layer 112*d* may extend beyond edges of the LED 114*d* a distance greater than half a width of the LED 114*d*, and according to some embodiments of the present invention, a distance that is greater than a width of the LED 114*d*. Moreover, the LED may be a horizontal LED such that the electrodes (i.e., the cathode and anode) thereof are on a surface of the LED 114*d* opposite the substrate 100*d*. Wirebonds 128*d* and 128*d*' may provide electrical coupling between electrodes of the LED 114*d* and the electrodes 111*d* and 110*d*.

In FIG. 1D, a second thermally conductive layer 113*d* may be provided on a backside 103*d* of the substrate 100*d* to enhance coupling of heat from the substrate 100*d* to a heat sink and/or to a thermally conductive portion of another circuit board (such as a printed circuit board). In addition, thermally conductive vias 201*d* may improve thermal coupling between the first thermally conductive layer 112*d* and the second thermally conductive layer 113*d*. During operation, heat from the LED 114*d* may be spread through the thermally conductive layer 112*d* and through the thermally conductive vias 201*d* to the second thermally conductive layer 113*d*. The thermally conductive layers 112*d* and 113*d* and the thermally conductive vias 201*d* may each include a thermally conductive material such as copper. Moreover, the backside 103*d* of the substrate 100d may be thermally coupled to a heat sink and/or to a thermally conductive portion of another substrate (such as a printed circuit board) so that heat is conducted away from the substrate 100d.

If the LED 114d is a vertical LED, a second electrode of the LED 114d may be coupled directly to the thermally conductive layer 112d, and wirebond 128d' may provide electrically coupling between the thermally conductive layer 112d and the electrode 110d. In an alternative, a conductive trace may be provided between the thermally conductive layer 112d and the electrode 110d as discussed above with respect to FIG. 1B so that a second wirebond is not required.

As further shown in FIG. 1D, secondary electrodes 111d' and 110d' may be provided on the backside 103d of the substrate 100d, and the secondary electrodes 111d' and 110d' may be electrically coupled to the electrodes 111d and 110d on the frontside 105d of the substrate 100d through electrically conductive vias 122d and 122d'. The substrate 100d can thus be mounted on a printed circuit board with the secondary electrodes 111d' and 110d' providing electrical coupling to the printed circuit board. In an alternative, conductive vias 122d and 122d' and secondary electrodes 111d' and 110d' may be omitted if electrical coupling to another substrate is provided directly to the electrodes 111d and 110d.

The LED package of FIG. 1E may include a thermally conductive layer 112e between the LED 114e and the substrate 100e, and the thermally conductive layer 112e may extend beyond edges of the LED 114e a distance greater than half a width of the LED 114e, and according to some embodiments of the present invention, a distance that is greater than a width of the LED 114e. Moreover, the LED may be a vertical LED such that the electrodes (i.e., the cathode and anode) thereof are on opposite surfaces of the LED 114e. Wirebond 128e may provide electrical coupling between a first electrode of the LED 114e and the electrodes 111e. A second electrode of the LED 114e may be electrically and mechanically coupled to the thermally conductive layer 112e.

In FIG. 1E, a second thermally conductive layer 113e may be provided on a backside 103e of the substrate 100ed to enhance coupling of heat from the substrate 100e to a heat sink and/or to a thermally conductive portion of another circuit board (such as a printed circuit board). In addition, thermally conductive vias 201e may improve thermal coupling between the first thermally conductive layer 112e and the second thermally conductive layer 113e. During operation, heat from the LED 114e may be spread through the thermally conductive layer 112e and through the thermally conductive vias 201e to the second thermally conductive layer 113e. The thermally conductive layers 112e and 113e and the thermally conductive vias 201e may each include a thermally conductive material such as copper. Moreover, the backside 103e of the substrate 100e may be thermally coupled to a heat sink and/or to a thermally conductive portion of another substrate (such as a printed circuit board) so that heat is conducted away from the substrate 100e. If the LED 114e is a horizontal LED, a second electrode of the LED 114e may be coupled to the thermally conductive layer 112e using a second wirebond.

As further shown in FIG. 1E, secondary electrodes 111e' and 110e' may be provided on the backside 103e of the substrate 100e. The secondary electrode 111e' may be electrically coupled to the electrode 111e on the frontside 105e of the substrate 100e through electrically conductive via 122e. The secondary electrode 110e' may be electrically coupled to the second thermally conductive layer 113e through a trace on the backside 103e of the substrate 100e. Accordingly, electrical coupling between the LED 114e and the electrode 110e' may be provided through the first thermally conductive layer 112e, through the thermally conductive traces 201e, and through the second thermally conductive layer 113e. According to some embodiments of the present invention, the secondary electrode 110e' and the second thermally conductive layer 113e may be provided as portions of a same layer of an electrically and thermally conductive layer and/or electrical coupling to another substrate may be provided directly to the second thermally conductive layer 113e. The substrate 100e can thus be mounted on a printed circuit board with the secondary electrodes 111e' and 110e' providing electrical coupling to the printed circuit board.

Referring to FIG. 2, according to some embodiments of the present invention, a metal and/or reflective cup (or ring) 212 may be provided around the LED 114f, and a pre-formed lens 210 may be secured within the reflective cup or ring 212 using an adhesive material 211. An electrically insulating material 213 may be provided between the ring 212 and the substrate 100f and/or other layers (such as electrodes 110f and/or 111f) on the substrate 100f. The first and second thermally conductive layers 112f and 113f may be thermally coupled using thermally conductive vias 201f that extend through the substrate 100f to the second thermally conductive layer 113f. As further illustrated in FIG. 2, the integrated heat spreading system including the thermally conductive layers 112f and 113f and the thermally conductive vias 201f may be electrically isolated from electrodes of the LED 114f and/or from electrodes 110f, 110f, 111f, and/or 111f'. Electrodes of the LED 114f may be electrically coupled to the electrodes 110A and/or 111A by wirebonds 128f and 128f'. Lenses and reflective cups may be fabricated as discussed, for example, in U.S. patent application Ser. No. 11/044,126 entitled "Methods For Packaging A Light Emitting Device And Packaged Light Emitting Devices" and filed Jan. 27, 2005, the disclosure of which is hereby incorporated herein in its entirety by reference.

As shown in FIG. 3, a light emitting device assembly may include one or more encapsulated regions according to some embodiments of the present invention. More particularly, a first meniscus control feature 303 on the substrate 100g may encircle the thermally conductive layer 112g to define a region confining an encapsulant material 301 on upper surface 105g of the substrate 100g within the periphery of the first meniscus control feature 303. A second meniscus control feature 304 may surround the region 301 and, together with the first meniscus control feature 303, may define an annular (or ring-shaped) region confining a lens material 302 on the upper surface 105g of the substrate 100g surrounding the first encapsulant region 301. The encapsulant material 301 may be dispensed as a liquid confined by the first meniscus control feature 303 and then cured. The lens material 302 may then be dispensed as a liquid confined by the second meniscus control feature 304 and then cured. The encapsulant material 301 and/or the lens material 302 may be an epoxy material(s).

As illustrated in FIG. 3, the lens material 302 may enclose and encompass the encapsulant material 301. While the lens material 302 may be annular as discussed above, the lens material 302 may be provided according to other shapes depending on shapes of the first meniscus control feature 303 and the second meniscus control feature 304 and depending on volumes of the encapsulant and/or lens materials dispensed. For example, the lens material may have an oval periphery. It will be understood that for a feature to "encircle" or "surround" a region, the feature need not be continuously formed around the region. Although the figures illustrate continuous meniscus control features, it may be possible for a meniscus control feature to include gaps or voids therein which do not affect the meniscus control function of the feature. Moreover, the feature need not form a circle, but could be provided in other two dimensional shapes such as ellipses, polygons, etc.

As further shown in FIG. 3, the wirebond pads 305 and 305' may be formed on the upper surface 105g of substrate 100g within the lens region surrounded by the second meniscus control feature 304. One of the conductive vias 122g may electrically couple a wire bond pad 305 and/or 305' with a respective lower electrode 111g' and/or 110g'. Another of the electrically conductive vias 122g may electrically couple a lower electrode 111g' and/or 110g' with a respective electrode 111g and/or 110g on an upper surface 105g of the substrate 100g. In another alternative (not shown), an electrically and thermally conductive via 201g may electrically couple the thermally conductive layer 112g with a lower electrode 111g' and/or 110g' so that a lower surface of a vertical LED may be electrically coupled to one of the lower electrodes 111g' and/or 110g' thereby eliminating one of the wirebonds 128g and/or 128g'. Moreover, the structure including LED 114g; vias 122g, 122g', and 201g; thermally conductive layers 112g and 113g; wirebond pads 305 and 305'; and electrodes 111g, 111g', 110g, and 110g' may be provided without encapsulant material 301 and lens material 302 so that the LED 114g is exposed as shown in FIGS. 1A-E. In an alternative, the structure of FIG. 3 may be provided with the reflector and lens structure of FIG. 2 instead of the encapsulant material and lens material.

Lenses may be fabricated as discussed, for example, in U.S. patent application Ser. No. 11/197,096 entitled "Packages for Semiconductor Light Emitting Devices Utilizing Dispensed Encapsulants And Methods Of Packaging The Same" and filed Aug. 4, 2005, and in U.S. patent application Ser. No. 11/336,369 entitled "Packages For Semiconductor Light Emitting Devices Utilizing Dispensed Reflectors And Methods Of Forming Same" and filed Jan. 20, 2006. The disclosures of both of the above referenced applications are hereby incorporated herein in their entirety by reference.

Figure 4C:
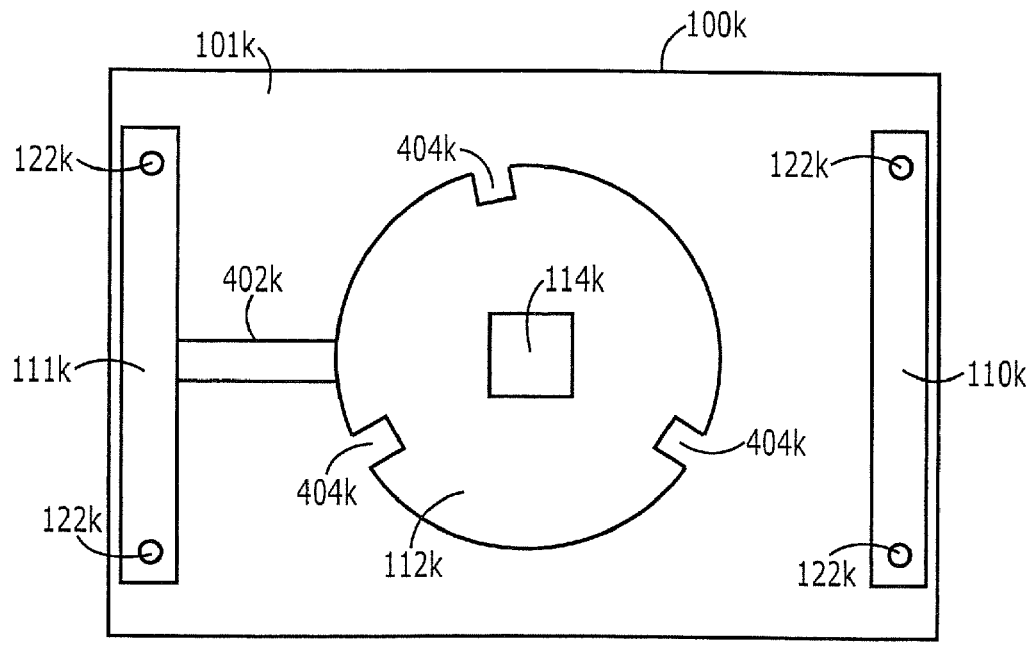

According to some embodiments of the present invention, the thermally conductive layer(s) 112a-g may be circular in a plan view or may have other shapes such as an oval, a polygon, etc. By way of example, the thermally conductive layer(s) 112a-g may be substantially circular as shown in FIGS. 4A-C. A substantially circular shape, for example, may efficiently spread heat while reducing unnecessary expansion (due to heating) that may result from an increased distance from an LED source 114a-g to corners of a square or rectangular thermally conductive layer.

As shown in the plan view FIG. 4A, an LED 114h may be provided on a substantially circular thermally conductive layer 112h. More particularly, the thermally conductive layer 112h may have a gap 401h therein electrically isolating a portion 112h' of the thermally conductive layer 112h. A trace 402h may provide electrical coupling between the thermally conductive layer 112h and electrode 111h, and a trace 403h may provide electrical coupling between the portion 112h' and electrode 110h. With a horizontal LED 114h (having both electrodes on an upper surface thereof), a first wirebond may provide electrical coupling between the main portion of the thermally conductive layer 112h and the LED 114h, and a second wirebond may provide electrical coupling between the portion 112h' and the LED 114h. The portion 112h' may provide a relatively large area for a wirebond connection without significantly reducing a heat spreading capacity of the thermally conductive layer 112h. With a vertical LED 114H (having electrodes on opposite surfaces thereof), a first surface of the LED 114h may be electrically and mechanically bonded (for example, using solder) to the main portion of the thermally conductive layer 112h, and a wirebond may provide electrical coupling of a second surface (opposite the thermally conductive layer) to the portion 112h' of the thermally conductive layer.

According to still other embodiments of the present invention, the thermally conductive layer 112h may be electrically isolated from the electrodes 111h and 110h (so that one or both of traces 402h and/or 403h may be eliminated). Without traces 402h and/or 403h, wirebonds may provide electrical coupling between the LED 114h and electrodes 111h and/or 110h. Moreover, a second thermally conductive layer (not shown) may be provided on a surface of the substrate 100h opposite the thermally conducive layer 112h as shown, for example, in FIGS. 1C, 1D, and 1E, and/or thermally conductive vias through the substrate 110h may provide thermal coupling between the thermally conductive layers on opposite sides of the substrate 100h as shown, for example, in FIGS. 1D and 1E.

As shown in FIG. 4B, notches 404i may be provided in the substantially circular thermally conductive layer 112i to reduce stress/strain due to thermal expansion. Heat generated by the LED 114i may thus be dissipated across the relatively large thermally conductive layer 112i while reducing thermal stress/strain across the thermally conductive layer. As shown in FIG. 4B, the notches 404i may be spaced around peripheral portions of the thermally conductive layer 112i. Moreover, the notches 112i may extend radially toward the LED 112i to reduce impedance of heat flow from the LED 114i toward edges of the thermally conductive layer 112i. The electrodes 111i and 110i, the traces 402i and 403i, the conductive vias 122i, and the substrate 100i may be provided and/or function as discussed above with respect to corresponding elements of FIG. 4A.

As further shown in FIGS. 4A and 4B, the electrically isolating gap 401h-i of FIGS. 4A-B may be formed using a solder mask when plating the thermally conductive layer, or the gap may be formed by subsequently patterning the thermally conductive layer (for example, using photolithographic mask and etch operations). This gap 401h or 401i may electrically isolate cathode and anode portions of the substantially circular thermally conductive layer while providing significant heat spreading. Electrically conductive traces 402h-i and/or 403h-i may electrically couple the portions 112h-i and/or 112h'-i' of the thermally conductive layer to the electrodes 110h-i and/or 110h-i.

According to further embodiments of the present invention, a substantially circular thermally conductive layer 112k may be electrically isolated from one or both of the electrodes 111k and/or 110k as shown in FIG. 4C. Moreover, the gap of FIGS. 4A and 4B may be omitted from the thermally conductive layer 112k, and notches 404k may be substantially evenly spaced around peripheral portions of the thermally conductive layer 112k. With three notches as shown in FIG. 4C, for example, the notches 404k may be spaced by approximately 120 degrees around the substantially circular thermally conductive layer 112k. With four notches, the notches may be spaced by approximately 90 degrees around the substantially circular thermally conductive layer.

Moreover, the notches 112k may extend radially toward the LED 112k to reduce impedance of heat flow from the LED 114k toward edges of the thermally conductive layer 112k. The electrodes 111k and 110k, the trace 402k, the conductive vias 122k, and the substrate 100k may be provided and/or function as discussed above with respect to corresponding elements of FIGS. 4A-B. By way of example, the LED may be a vertical LED with a first surface electrically and mechanically bonded (for example, soldered) to the thermally conductive layer, and a wirebond may provide electrical coupling between a second surface of the LED 114K and the electrode 110k. In an alternative, the LED 114k may be a horizontal LED with a first wirebond providing electrical coupling between a first portion of the LED 114k and the thermally conductive layer 112k and with a second wirebond providing electrical coupling between a second portion of the LED and the electrode 110k.

Any of the thermally conductive layers 112h, 112i, and/or 112k of FIGS. 4A-C may be electrically coupled to a second thermally conductive layer on an opposite side of the substrate 100h, 100i, and/or 100k, for example, using thermally conductive vias. According to some embodiments of the present invention, any such thermally conductive vias may be offset relative to the LED 114h, 114i, and/or 114k to provide a more planar surface to which the LED may be bonded. According to other embodiments of the present invention, the one or more thermally conductive vias may be provided directly between the LED and the second thermally conductive layer on the opposite side of the substrate. Moreover, any of the patterns of thermally conductive layers 112h, 112i, and/or 112k discussed above with respect to FIGS. 4A-C may be used for the thermally conductive layers discussed herein with respect to FIGS. 1A-E, 2, 3, and/or 5. Moreover, each of the substantially circular thermally conductive layers 112h, 112i, and/or 112k may extend beyond edges of the respective LED 114h, 114i, and/or 114k a distance that is greater than half of a width of the LED, and according to some embodiments of the present invention, a distance that is greater than a width of the LED.

Figure 5:
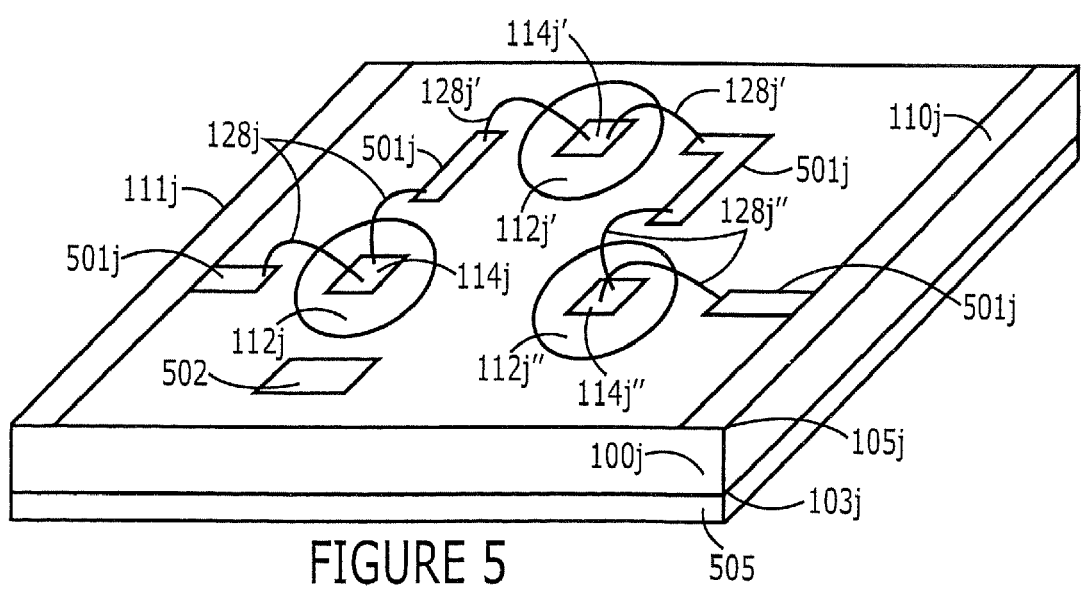
FIG. 5 is a perspective view illustrating multi-chip light emitting device packages according to still other embodiments of the present invention.

Further embodiments of the present invention may include a plurality of LEDs on a same substrate, such as a three-chip-in series layout illustrated in FIG. 5. In FIG. 5, three LEDs 114j, 114j', and 114j" may be electrically coupled in series. For purposes of illustration, each LED 114j, 114j', 114j" may be provided in a configuration similar to that discussed above with respect to FIG. 1A. Electrodes 111j and/or 110j may be electrically coupled to respective conductive traces 501j, and additional conductive traces may be provided between LEDs 114j, 114j', and/or 114j". As shown in FIG. 5, each LED 114j, 114j', and/or 114j" may be electrically coupled to traces using respective wirebond pairs 128j, 128j', and/or 128j". As shown in FIG. 5, the thermally conductive layers 112j, 112j', and/or 112j" may be electrically isolated from the electrodes 110j and/or 111j and/or from traces 501j.

While a pair of wirebonds is provided for each LED in FIG. 5, a number of wirebonds and/or traces may be reduced by providing wirebond connections directly between LEDs and/or directly to the electrodes 111j and/or 110j. As further shown in FIG. 5, horizontal LEDs may be used with both electrical couplings to each LED on a surface of the LED opposite the substrate 100j. With vertical LEDs, first electrical couplings may be from LEDs 114j, 114j', and/or 114j" to the respective thermally conductive layer 112j, 112j', and/or 112j'", and second electrical couplings may be provided using wirebonds to surfaces of the LEDs 114j, 114j', and/or 114j" opposite the substrate 100j.

Second thermally conductive layers may be provided on a backside of the substrate 100j opposite the thermally conductive layers 112j, 112j', and/or 112j'" as discussed above with respect to FIGS. 1C-E, 2, and 3. For example, a separate second thermally conductive layer may be provided for each of the first thermally conductive layers 112j, 112j', and/or 112j". If no electrical connections are provided to a backside of the substrate 100j, a continuous second thermally conductive layer 505 may be provided across the backside 103j of the substrate 100j. Moreover, thermally conductive vias may be provided through the substrate 100j between one or more of the thermally conductive layers 112j, 112j', and/or 112j" and any such second thermally conductive layer on the backside 103j of the substrate 100j.

In addition, the series of LED chips 114j, 114j', 114j" may also be coupled to an ESD (electrostatic discharge) protection chip 502 (such as a zener diode). Integrated heat spreading, according to embodiments of the present invention, may provide conditions more favorable for the use of thin film and direct bond technologies, allowing multiple LED chips on a single small form factor LED package. According to some embodiments of the present invention, heat generated by such a multi-chip assembly may be transferred away from the LEDs more effectively.

Each of the thermally conductive layers 112j, 112j', and/or 112j'" may be substantially circular and/or may include notches therein as discussed above with respect to FIGS. 4A-C. Moreover, a reflective cup, a preformed lens, meniscus control features, and/or liquid dispensed/cured lenses may be provided for the LED's 114j, 114j', and/or 114j" as discussed above with respect to FIGS. 2 and/or 3.

A thermally conductive layer (e.g., thermally conductive layers 112a-k discussed above) according to some embodiments of the present invention may thus provide a heat spreader that is integral with respect to the substrate (e.g., substrates 100a-k discussed above) on which it is formed. Thermal transport of heat from an LED (e.g., LEDs 114a-k) into the substrate and/or a heat sink can be improved, so that the LED can be operated at higher power, for example, up to 5 Watts. Thermally conductive layers according to some embodiments of the present invention may be formed using thin film processing of highly conductive metals and photolithographic patterning. Thermally conductive layers according to some embodiments of the present invention may enable direct flux die attach and/or attachment of a discrete zener diode for ESD protection.

More particularly, the thermally conductive layers 112a-k discussed above with respect to FIGS. 1A-E, 2, 3, 4A-C, and 5 may be formed, for example, by plating, sputtering, and/or evaporating one or more layers of a metal(s) such as nickel, copper, gold, and/or silver. Thermally conductive vias (e.g., conductive vias 201d-g) may be provided using a highly thermally conductive material such as copper in a hole through the substrate to aid thermal transport of heat through the substrate. Moreover, the thermally conductive layers 112a-k may enable a direct die attach of the LED 114a-k, for example, using flux instead of a gold/tin solder paste. A thickness of a bond between the LED and the thermally conductive layer may thus be reduced to improve a thermal interface and to reduce voiding.

By providing relatively precise patterning of the thermally conductive layer (for example, using photolithographic patterning) multiple LED chips may be provided on a same substrate as shown, for example, in FIG. 5. For example, multiple LEDs of a same color (such as red, blue, green, or white) may be provided on a same substrate. In an alternative, a combination of red, blue, and green LEDs may be provided on a same substrate. In addition, direct die attachment may enable provision of an LED and a discrete zener diode (for ESD protection) on a same substrate as shown in FIG. 5. Use of thin film technology may also enable provision of a thermally conductive layer and/or thermally conductive vias that are electrically isolated as shown, for example, in FIGS. 1A, 1D, 2, and 3. Stated in other words, the thermal path may be electrically isolated.

According to some embodiments of the present invention, a thermally conductive layer (e.g., layers 112a-k) may be formed by sputtering a seed layer (such as a layer of titanium) through a stencil to provide a desired pattern of the thermally conductive layer on the substrate (e.g., substrates 100*a-k*). A copper may then be plated on the seed layer. The seed layer may have a thickness, for example, in the range of about 20 micrometers to about 150 micrometers, and the copper layer may have a thickness of about 75 micrometers.

According to some other embodiments of the present invention, a thermally conductive layer (e.g., layers 112*a-k*) may be formed by printing a paste (including a thermally conductive metal) through a stencil and baking to remove organics. The resulting metal layer may be subjected to an anneal and/or a stamping operation to reduce porosity, increase thermal conductivity, increase planarity, etc. According to still other embodiments of the present invention, a thermally conductive layer (e.g., layers 112*a-k*) may be provided as a metal perform that is pressed into place, and the perform may then be further subjected to an anneal to improve adhesion to the substrate. Moreover, a thermally conductive layer formed according to any of the techniques discussed above may be further subjected to a rolling and/or stamping operation to further improve characteristics thereof.

As discussed above with respect to FIGS. 1A-K, 2-3, 4A-C, and 5, the LED 114*a-k* may be centered relative to the respective thermally conductive layer 112*a-k* according to some embodiments of the present invention. The LED 114*a-k*, however, is not required to be centered relative to the respective thermally conductive layer 112*a-k* according to all embodiments of the present invention. The LED 114*a-k*, for example, may be offset relative to a center of the respective thermally conductive layer 112*a-k* according to some embodiments of the present invention. Moreover, the LED 114*a-k* may be provided adjacent to an edge of the respective thermally conductive layer 112*a-k* so that the thermally conductive layer does not extend significantly beyond at least one edge of the LED 114*a-k*.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A light emitting device (LED) assembly comprising:
an electrically insulating substrate;
a continuous thermally conductive layer adjacent a surface of the electrically insulating substrate;
a light emitting device adjacent the continuous thermally conductive layer so that the continuous thermally conductive layer is between an entirety of the light emitting device and the electrically insulating substrate, wherein the continuous thermally conductive layer extends beyond an edge of the light emitting device in at least one direction a distance greater than half of a width of the light emitting device; and
a plurality of thermally conductive vias through the electrically insulating substrate, wherein the plurality of thermally conductive vias are thermally and electrically coupled to the continuous thermally conductive layer and wherein portions of the electrically insulating substrate adjacent the light emitting device are free of the plurality of thermally conductive vias.

2. A light emitting device assembly according to claim 1, wherein the plurality of thermally conductive vias extend from the continuous thermally conductive layer through the electrically insulating substrate.

3. A light emitting device assembly according to claim 1, wherein the continuous thermally conductive layer comprises at least one of a metal layer, a ceramic layer, and/or a semiconductor layer.

4. A light emitting device assembly according to claim 3, wherein the continuous thermally conductive layer comprises a copper layer.

5. A light emitting device assembly according to claim 1, wherein the continuous thermally conductive layer is electrically conductive, the light emitting device assembly further comprising:
a first electrical coupling between a first terminal of the light emitting device and the continuous thermally conductive layer;
an electrode on the electrically insulating substrate wherein the electrode and the continuous thermally conductive layer are electrically isolated; and
a second electrical coupling between a second terminal of the light emitting device and the electrode.

6. A light emitting device assembly according to claim 1, wherein the continuous thermally conductive layer is electrically conductive and wherein the light emitting device includes first and second terminals on a surface of the light emitting device opposite the continuous thermally conductive layer, the light emitting device assembly further comprising:
first and second electrodes, each of which is electrically isolated from the continuous thermally conductive layer;
a first electrical coupling between the first terminal of the light emitting device and the first electrode; and
a second electrical coupling between the second terminal of the light emitting device and the second electrode.

7. A light emitting device assembly according to claim 1, wherein the continuous thermally conductive layer is electrically conductive and wherein the thermally conductive layer comprises a substantially circular thermally conductive layer.

8. A light emitting device according to claim 1 wherein the continuous thermally conductive layer extends beyond opposing edges of the light emitting device a distance greater than half of a width of the light emitting device.

9. A light emitting device assembly according to claim 1 wherein the continuous thermally conductive layer extends beyond an edge of the light emitting device in at least one direction a distance that is greater than a width of the light emitting device.

10. A light emitting device assembly according to claim 1 wherein the thermally conductive layer comprises a first thermally conductive layer, the light emitting device further comprising:
a second thermally conductive layer adjacent a surface of the electrically insulating substrate opposite the first thermally conductive layer wherein the electrically insulating substrate is between the light emitting device and the second thermally conductive layer in a direction perpendicular with respect to a surface of the electrically insulating substrate and wherein all portions of the electrically insulating substrate between the light emitting device and the second thermally conductive layer in the direction perpendicular with respect to the surface of the electrically insulating substrate are free of the thermally conductive vias so that portions of the light emitting device and the first and second thermally conductive layers are aligned in the direction perpendicular with respect to the surface of the electrically insulating substrate.

11. A light emitting device assembly according to claim 1 wherein the electrically insulating substrate comprises a ceramic substrate.

12. A light emitting device assembly according to claim 1 further comprising:
   a lens on the light emitting device so that the light emitting device is between the lens and the ceramic substrate.

13. A light emitting device assembly according to claim 1 further comprising:
   a reflector on the ceramic substrate around the light emitting device.

14. A light emitting device (LED) assembly comprising:
   an electrically insulating substrate;
   a thermally conductive layer adjacent a surface of the electrically insulating substrate, wherein the thermally conductive layer is electrically conductive and wherein the thermally conductive layer comprises a substantially circular thermally conductive layer wherein the substantially circular thermally conductive layer comprises a plurality of notches around a perimeter thereof;
   a light emitting device adjacent the thermally conductive layer so that the thermally conductive layer is between the light emitting device and the electrically insulating substrate, wherein the thermally conductive layer extends beyond an edge of the light emitting device in at least one direction a distance greater than half of a width of the light emitting device; and
   a plurality of thermally conductive vias through the electrically insulating substrate, wherein the plurality of thermally conductive vias are thermally coupled to the thermally conductive layer and wherein portions of the electrically insulating substrate adjacent the light emitting device are free of the plurality of thermally conductive vias.

15. A light emitting device assembly according to claim 14, wherein each of the notches extends radially from the perimeter of the thermally conductive layer toward the light emitting device.

16. A light emitting device (LED) assembly comprising:
   an electrically insulating substrate;
   a thermally conductive layer adjacent a surface of the electrically insulating substrate, wherein the thermally conductive layer is electrically conductive and wherein the thermally conductive layer comprises a substantially circular thermally conductive layer;
   a light emitting device adjacent the thermally conductive layer so that the thermally conductive layer is between the light emitting device and the electrically insulating substrate, wherein the thermally conductive layer extends beyond an edge of the light emitting device in at least one direction a distance greater than half of a width of the light emitting device;
   a plurality of thermally conductive vias through the electrically insulating substrate, wherein the plurality of thermally conductive vias are thermally coupled to the thermally conductive layer and wherein portions of the electrically insulating substrate adjacent the light emitting device are free of the plurality of thermally conductive vias; and
   a conductive trace on the electrically insulating substrate, wherein the conductive trace extends from the substantially circular thermally conductive layer.

17. A light emitting device assembly comprising:
   an electrically insulating substrate having opposing first and second surfaces;
   a first thermally conductive layer adjacent the first surface of the electrically insulating substrate wherein the first thermally conductive layer is electrically conductive and wherein the first thermally conductive layer comprises a substantially circular first thermally conductive layer;
   a second thermally conductive layer adjacent the second surface of the electrically insulating substrate so that the electrically insulating substrate is between the first and second thermally conductive layers;
   a light emitting device adjacent the first thermally conductive layer so that portions of the first thermally conductive layer are between the light emitting device and the electrically insulating substrate in a direction perpendicular with respect to a surface of the electrically insulating substrate, and so that the electrically insulating substrate is between the light emitting device and portions of the second thermally conductive layer in the direction perpendicular with respect to the surface of the electrically insulating substrate; and
   a plurality of thermally conductive vias, wherein the plurality of thermally conductive vias are thermally coupled between the first and second thermally conductive layers and wherein portions of the electrically insulating substrate between the light emitting device and the second thermally conductive layer are free of the thermally conductive vias; and
   a conductive trace on the electrically insulating substrate, wherein the conductive trace extends from the substantially circular first thermally conductive layer.

18. A light emitting device assembly according to claim 17, wherein the plurality of thermally conductive vias extend from the first thermally conductive layer through the electrically insulating substrate to the second thermally conductive layer.

19. A light emitting device assembly according to claim 17, wherein the first thermally conductive layer extends beyond an edge of the light emitting device in at least one direction a distance greater than half of a width of the light emitting device.

20. A light emitting device assembly according to claim 17 wherein the first thermally conductive layer extends beyond any edge of the light emitting device in at least one direction a distance greater than a width of the light emitting device.

21. A light emitting device assembly according to claim 17 wherein the first thermally conductive layer extends beyond opposing edges of the light emitting device a distance greater than half of a width of the light emitting device.

22. A light emitting device assembly according to claim 17, wherein each of the first and second thermally conductive layers comprises at least one of a metal layer, a ceramic layer, and/or a semiconductor layer.

23. A light emitting device assembly according to claim 22, wherein the first thermally conductive layer and/or second thermally conductive layer comprises a copper layer.

24. A light emitting device assembly according to claim 22 wherein the first thermally conductive layer is electrically isolated from first and second terminals of the LED.

25. A light emitting device assembly according to claim 17, wherein the first and second thermally conductive layers are electrically conductive, the light emitting device assembly further comprising:
   a first electrical coupling between a first terminal of the light emitting device and the first thermally conductive layer;
   an electrode on the electrically insulating substrate wherein the terminal and the first and second thermally conductive layers are electrically isolated; and
   a second electrical coupling between a second terminal of the light emitting device and the electrode.

26. A light emitting device assembly according to claim 17, wherein the first and second thermally conductive layers are electrically conductive, the light emitting device assembly further comprising:
   first and second electrodes, each of which is electrically isolated from the first and second thermally conductive layers;
   a first electrical coupling between a first terminal of the light emitting device and the first electrode; and
   a second electrical coupling between a second terminal of the light emitting device and the second electrode.

27. A light emitting device assembly according to claim 17 wherein all portions of the electrically insulating substrate between the light emitting device and the second thermally conductive layer in the direction perpendicular with respect to the surface of the electrically insulating substrate are free of the plurality of thermally conductive vias.

28. A light emitting device assembly according to claim 17 wherein the electrically insulating substrate comprises a ceramic substrate.

29. A light emitting device assembly according to claim 17 further comprising:
   a lens on the light emitting device so that the light emitting device is between the lens and the ceramic substrate.

30. A light emitting device assembly according to claim 17 further comprising:
   a reflector on the ceramic substrate around the light emitting device.

31. A light emitting device assembly according to claim 17 wherein all portions of the electrically insulating substrate within an area defined by a perimeter of the light emitting device are free of the thermally conductive vias.

32. A light emitting device assembly comprising:
   an electrically insulating substrate having opposing first and second surfaces;
   a first thermally conductive layer adjacent the first surface of the electrically insulating substrate wherein the first thermally conductive layer is electrically conductive and wherein the first thermally conductive layer comprises a substantially circular first thermally conductive layer comprising a plurality of notches around a perimeter thereof;
   a second thermally conductive layer adjacent the second surface of the electrically insulating substrate so that the electrically insulating substrate is between the first and second thermally conductive layers;
   a light emitting device adjacent the first thermally conductive layer so that portions of the first thermally conductive layer are between the light emitting device and the electrically insulating substrate in a direction perpendicular with respect to a surface of the electrically insulating substrate, and so that the electrically insulating substrate is between the light emitting device and portions of the second thermally conductive layer in the direction perpendicular with respect to the surface of the electrically insulating substrate; and
   a plurality of thermally conductive vias, wherein the plurality of thermally conductive vias are thermally coupled between the first and second thermally conductive layers and wherein portions of the electrically insulating substrate between the light emitting device and the second thermally conductive layer are free of the thermally conductive vias.

33. A light emitting device (LED) assembly comprising:
   an electrically insulating substrate;
   a substantially circular thermally conductive layer adjacent a surface of the insulating substrate; and
   a light emitting device adjacent the substantially circular thermally conductive layer so that the substantially circular thermally conductive layer is between the light emitting device and the electrically insulating substrate, wherein an edge of the substantially circular thermally conductive layer extends laterally beyond an edge of the light emitting device;
   wherein the substantially circular thermally conductive layer includes a plurality of notches around a perimeter thereof.

34. A light emitting device assembly according to claim 33, wherein a first portion of the substantially circular thermally conductive layer is electrically isolated from a second portion of the substantially circular thermally conductive layer.

35. A light emitting device assembly according to claim 33, wherein each of the notches extends radially from the perimeter of the substantially circular thermally conductive layer toward the light emitting device.

36. A light emitting device assembly according to claim 33, further comprising:
   a conductive trace on the electrically insulating substrate, wherein the conductive trace extends from the substantially circular thermally conductive layer.

37. A light emitting device assembly according to claim 33 wherein the substantially circular thermally conductive layer extends beyond an edge of the light emitting device a distance greater than half of a width of the light emitting device.

38. A light emitting device assembly according to claim 33 wherein the substantially circular thermally conductive layer extends beyond an edge of the light emitting device a distance greater than a width of the light emitting device.

39. A light emitting device assembly according to claim 33 wherein the substantially circular thermally conductive layer extends beyond opposing edges of the light emitting device a distance greater than half of a width of the light emitting device.

40. A light emitting device assembly according to claim 33, wherein the substantially circular thermally conductive layer comprises at least one of a metal layer, a ceramic layer, and/or a semiconductor layer.

41. A light emitting device assembly according to claim 33, further comprising:
   a second thermally conductive layer adjacent a second surface of the electrically insulating substrate so that the electrically insulating substrate is between the substantially circular thermally conductive layer and the second thermally conductive layer; and
   a plurality of thermally conductive vias, wherein the plurality of thermally conductive vias are thermally and physically coupled between the substantially circular thermally conductive layer and the second thermally conductive layer and wherein portions of the substrate between the light emitting device and the second thermally conductive layer are free of the plurality of thermally conductive vias.

42. A light emitting device according to claim 41 wherein first and second terminals of the light emitting device are electrically isolated from the substantially circular thermally conductive layer.

43. A light emitting device assembly according to claim 33, further comprising:
   a second thermally conductive layer adjacent a second surface of the electrically insulating substrate so that the electrically insulating substrate is between the substantially circular thermally conductive layer and the second thermally conductive layer; and a plurality of thermally conductive vias, wherein the plurality of thermally conductive vias are thermally and physically coupled between the substantially circular thermally conductive layer and the second thermally conductive layer and wherein the plurality of thermally conductive vias extend through portions of the electrically insulating substrate outside a region of the electrically insulating substrate defined by a periphery of the light emitting device.

44. A light emitting device assembly according to claim 33, wherein the substantially circular thermally conductive layer extends continuously from the light emitting device to portions of the perimeter between each of the notches.

45. A light emitting device assembly according to claim 41 wherein all portions of the electrically insulating substrate between the light emitting device and the second thermally conductive layer in a direction perpendicular with respect to a surface of the electrically insulating substrate are free of the plurality of thermally conducive vias.

46. A light emitting device assembly according to claim 43 wherein all portions of the electrically insulating substrate between the light emitting device and the second thermally conductive layer in a direction perpendicular with respect to a surface of the electrically insulating substrate are free of the plurality of thermally conductive vias.

47. A light emitting device assembly according to claim 33 wherein the electrically insulating substrate comprises a ceramic substrate.

48. A light emitting device assembly according to claim 33 further comprising:
a lens on the light emitting device so that the light emitting device is between the lens and the ceramic substrate.

49. A light emitting device assembly according to claim 33 further comprising:
a reflector on the ceramic substrate around the light emitting device.

50. A light emitting device (LED) assembly comprising:
an electrically insulating ceramic substrate having opposing first and second faces;
a first thermally conductive layer on a first surface of the ceramic substrate;
a second thermally conductive layer on the second surface of the ceramic substrate so that the ceramic substrate is between the first and second thermally conductive layers, wherein the second thermally conductive layer is electrically isolated from the first thermally conductive layer; and
a light emitting device on the first thermally conductive layer so that the first thermally conductive layer is between the light emitting device and the ceramic substrate, wherein portions of the light emitting device and the first and second thermally conductive layers are aligned in a direction perpendicular with respect to a surface of the light emitting device wherein the first thermally conductive layer comprises a continuous thermally conductive layer between an entirety of the light emitting device and the ceramic substrate.

51. A light emitting device assembly according to claim 50 wherein the first and second thermally conductive layers comprise respective first and second thermally conductive metal layers.

52. A light emitting device assembly according to claim 51 wherein the light emitting device is a vertical light emitting device with a first terminal on a surface of the light emitting device adjacent the first thermally conductive metal layer and a second terminal on a surface of the light emitting device opposite the first thermally conductive metal layer, the light emitting assembly further comprising:
a wire bond pad spaced apart from the first thermally conductive metal layer on the first surface of the ceramic substrate; and
a wire bond providing an electrical connection between the second terminal of the light emitting device and the wire bond pad.

53. A light emitting device assembly according to claim 52 further comprising:
first and second electrodes on the second face of the electrically insulating ceramic substrate wherein the first and second electrodes are spaced apart and electrically isolated from the second thermally conductive metal layer;
a first electrically conductive via providing electrical coupling between the first thermally conductive metal layer and the first electrode through the ceramic substrate; and
a second electrically conductive via providing electrical coupling between the wire bond pad and the second electrode through the ceramic substrate.

54. A light emitting device assembly according to claim 50 wherein the ceramic substrate comprises an alumina substrate.

55. A light emitting device assembly according to claim 50 further comprising:
a lens on the light emitting device so that the light emitting device is between the lens and the ceramic substrate.

56. A light emitting device assembly according to claim 50 further comprising:
a reflector on the ceramic substrate around the light emitting device.

57. A light emitting device assembly comprising:
an electrically insulating substrate having opposing first and second surfaces;
a first thermally conductive layer adjacent the first surface of the electrically insulating substrate;
a second thermally conductive layer adjacent the second surface of the electrically insulating substrate so that the electrically insulating substrate is between the first and second thermally conductive layers;
a light emitting device adjacent the first thermally conductive layer so that portions of the first thermally conductive layer are between the light emitting device and the electrically insulating substrate in a direction perpendicular with respect to a surface of the electrically insulating substrate, and so that the electrically insulating substrate is between the light emitting device and portions of the second thermally conductive layer in the direction perpendicular with respect to the surface of the electrically insulating substrate so that portions of the light emitting device and the first and second thermally conductive layers are aligned in the direction perpendicular with respect to the surface of the electrically insulating substrate; and
a plurality of thermally conductive vias, wherein the plurality of thermally conductive vias are thermally coupled between the first and second thermally conductive layers and wherein portions of the electrically and the second thermally conductive layer are free of the thermally conductive vias;
wherein the plurality of thermally conductive vias are outside an area of the first thermally conductive layer defined by a perimeter of the light emitting device.

58. A light emitting device assembly according to claim 57 wherein the first thermally conductive layer is electrically conductive and wherein the first thermally conductive layer comprises a substantially circular first thermally conductive layer, further comprising:
- a conductive trace on the electrically insulating substrate, wherein the conductive trace extends from the substantially circular first thermally conductive layer.

59. A light emitting device assembly according to claim 57 wherein an area of the first thermally conductive layer defined within a perimeter of the light emitting device is free of all thermally conductive vias.

* * * * *

UNITED STATES PATENT AND TRADEMARK OFFICE
CERTIFICATE OF CORRECTION

PATENT NO. : 7,808,013 B2
APPLICATION NO. : 11/590480
DATED : October 5, 2010
INVENTOR(S) : Medendorp, Jr. et al.

Page 1 of 1

It is certified that error appears in the above-identified patent and that said Letters Patent is hereby corrected as shown below:

On Title Page:
Item (75) Inventors: Please correct "Nicholas W. Mendendorp, Jr."
to read -- Nicholas W. Medendorp, Jr. --

Item (56) References Cited, Page 2, U.S. Patent Documents: Please correct by adding -- 6,604,135 * 2/1997 Edmond et al. --

Other Publications: Please correct by adding -- International Search Report and Written Opinion for PCT/US2007/022576; date of mailing 03/10/2008 --
and -- U.S. Patent Application 11/336,369 filed January 20, 2006 entitled "Packages for Semiconductor Light Emitting Devices Utilizing Dispensed Reflectors and Methods of forming Same". --

In the Claims:
Column 24, Claim 57, Line 60: Please correct "electrically and the second"
to read -- electrically insulating substrate between the light emitting device and the second --

Signed and Sealed this
Twenty-ninth Day of March, 2011

David J. Kappos
*Director of the United States Patent and Trademark Office*